United States Patent
Dobashi et al.

(10) Patent No.: US 12,222,690 B2
(45) Date of Patent: Feb. 11, 2025

(54) PROCESS RECIPE SEARCH APPARATUS, ETCHING RECIPE SEARCH METHOD AND SEMICONDUCTOR DEVICE MANUFACTURING SYSTEM

(71) Applicant: Hitachi High-Tech Corporation, Tokyo (JP)

(72) Inventors: Takashi Dobashi, Hillsboro, OR (US); Hiroyuki Kobayashi, Hillsboro, OR (US); Takeshi Ohmori, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 626 days.

(21) Appl. No.: 17/370,131

(22) Filed: Jul. 8, 2021

(65) Prior Publication Data

US 2023/0012173 A1 Jan. 12, 2023

(51) Int. Cl.
*G05B 13/04* (2006.01)
*G06N 20/00* (2019.01)
*G06T 7/00* (2017.01)
*H01L 21/3065* (2006.01)
*H01L 21/66* (2006.01)
*H01L 21/67* (2006.01)

(52) U.S. Cl.
CPC .......... *G05B 13/042* (2013.01); *G06N 20/00* (2019.01); *G06T 7/0006* (2013.01); *H01L 21/3065* (2013.01); *H01L 21/67253* (2013.01); *H01L 22/20* (2013.01); *G05B 2219/45031* (2013.01); *G06T 2207/20081* (2013.01); *G06T 2207/30148* (2013.01)

(58) Field of Classification Search
CPC .......... G06T 2207/30148; G06T 7/001; G06T 2207/20084; G05B 13/026; G05B 13/0265; G05B 2219/45031; G06N 20/00; G06F 16/90335
See application file for complete search history.

(56) References Cited

U.S. PATENT DOCUMENTS

| | | | |
|---|---|---|---|
| 7,292,906 B2 * | 11/2007 | Funk | H01L 21/67253 700/121 |
| 7,502,709 B2 * | 3/2009 | Funk | H01L 22/20 702/183 |
| 7,517,708 B2 * | 4/2009 | Deshpande | G01B 11/06 438/18 |
| 7,580,767 B2 * | 8/2009 | MacDonald | G05B 13/04 702/182 |
| 10,198,664 B2 * | 2/2019 | Huang | G06F 18/22 |
| 10,360,730 B2 * | 7/2019 | Hasegawa | G06T 7/70 |
| 2016/0078315 A1 * | 3/2016 | Huang | G06V 10/75 382/218 |

(Continued)

FOREIGN PATENT DOCUMENTS

WO WO-2021111511 A1 * 6/2021 .......... G05B 13/042

*Primary Examiner* — Darrin D Dunn
(74) *Attorney, Agent, or Firm* — Miles & Stockbridge, P.C.

(57) ABSTRACT

To facilitate evaluation of a predicted process shape in process recipe development using machine learning, a process recipe search apparatus that searches for an etching recipe that is a parameter of a plasma processing apparatus set so as to etch a sample into a desired shape displays, on a display device, the predicted process shape of the sample by a candidate etching recipe predicted by using a machine leaning model, by highlighting a difference between the predicted process shape and a target shape.

12 Claims, 14 Drawing Sheets

(56) References Cited

U.S. PATENT DOCUMENTS

2018/0082873 A1    3/2018  Ohmori et al.
2020/0034650 A1*  1/2020  Takahashi ............... G06F 18/22
2021/0035277 A1*  2/2021  Ishikawa .................. G06T 5/73
2021/0366101 A1* 11/2021  George Boehm, Jr. ....................
                                                              G06T 7/0004

* cited by examiner

NORMAL DISPLAY

HIGHLIGHT DISPLAY

HIGHLIGHT DISPLAY
(SEPARATED BY COLOR)

HIGHLIGHT DISPLAY
(THICKNESS OF LINE)

HIGHLIGHT DISPLAY
(VECTOR)

PROCESS RECIPE SEARCH APPARATUS, ETCHING RECIPE SEARCH METHOD AND SEMICONDUCTOR DEVICE MANUFACTURING SYSTEM

BACKGROUND OF THE INVENTION

The present invention relates to a process recipe search apparatus, an etching recipe search method, and a semiconductor device manufacturing system.

Due to requirement for reducing power consumption and increasing storage capacity, semiconductor devices are being miniaturized and made into three dimensions (complicated) in device structure. The manufacture of the miniaturized devices is required, not only to simply reduce pattern dimensions but also to achieve process shapes that are more complicated as compared with those of conventional semiconductor devices. To achieve the process shape to be targeted (referred to as a target shape) by dry etching, it is necessary to set many parameters that control the gas system, the power supply system, and the high frequency system included in an etching apparatus. To achieve the complicated process shape, the processing is required to be performed for time in seconds while adjusting many parameters in a plurality of steps, so that it is necessary to set an enormous number of parameters for processing one pattern. Consequently, even a skilled person requires much time for such setting of the parameters for causing the etching apparatus to execute the processing. A process condition performing the etching or the parameter set to execute the process condition is called an etching recipe.

As a method for determining an enormous number of parameters in the etching processing at high accuracy and at high speed, a method using machine learning is known. The structures of the semiconductor devices processed under a plurality of process conditions are observed by an electron microscope, and the acquired images are measured to convert the process results into numerical values. A machine learning model is created from the etching recipes used for a plurality of processes and the process results that are converted into numerical values. The etching recipes that are likely to be candidates are inputted to the machine learning model, so that the process shapes after the etching can be virtually predicted. The etching recipes to achieve the process shapes approximate to the target shape are searched for from many prediction results, so that the complicated etching conditions can be efficiently found. U.S. Patent Application Publication No. 2018/0082873 is an example thereof.

Search for the etching recipe using the machine learning model has some problems.

A first problem is choice of whether or not the candidate etching recipe is good. Due to the complexity of the machine learning model, a plurality of candidate etching recipes are typically acquired. It is rare to actually perform the processing by all the candidate etching recipes, and from among the plurality of candidate etching recipes, the candidate etching recipes actually processed are required to be narrowed down. For this, the user uses predicted process shapes by the candidate etching recipes. For example, trench processing that is typical in the semiconductor process is taken as an example, and then, for a trench shape (target shape) having a depth of 100 nm and a width of 30 nm, the shape accuracy required for each of the depth and the width can be 0.5 nm. Note that the dimensions of the target shape are typically decided over several locations from the top to the bottom of the trench structure.

When such the predicted process shapes by the plurality of candidate etching recipes with respect to the target shape are imaged and visualized, at a resolution of 0.1 nm/pix, the process accuracy is only different by about 5 pix from the trench shape that is 1000 pix in the depth direction and is 300 pix in width. When the predicted process shapes overlap with the range of about 5 pix, it is difficult to grasp the feature of each of the predicted process shapes to determine whether or not the candidate etching recipe is good, and narrow down the candidate etching recipes.

A second problem is that when a plurality of candidate etching recipes are narrowed down from the predicted process shapes, the candidate etching recipes chosen simply because the predicted process shapes are the most approximate to the target shape are not always optimal solutions. For example, the candidate etching recipe having too high sensitivity with respect to the process condition is not desirable. The sensitivity is an index about how much the predicted process shape is affected when one of the process conditions (for example, the gas flow rate, the voltage applied to the electrode, and the like) is slightly changed. From the viewpoint of the reproductivity of the etching processing, the candidate etching recipe such that for example, the predicted process shape is significantly changed when the gas flow rate or the voltage and the electric current applied to the electrode is slightly changed is not desirable. However, it is difficult for even a skilled process engineer to guess the sensitivity from the predicted process shape determined from the process condition of the candidate etching recipe and the machine learning model.

Further, in search for the etching recipe, the predicted process shape can be chosen because it is approximate to the target shape and search for the unexecutable etching recipe can be continued as it is while the fact that the candidate etching recipe includes the process condition that cannot be set in the etching apparatus performing the processing is overlooked. A third problem is that such the meaningless search is avoided. As an avoiding method, it can be considered that a constraint condition is added to a computer program that automatically searches for the etching recipe, thereby performing the search that avoids the non-settable process condition. However, the conditions of the etching apparatus including the control of the gas system, the high frequency system, and the like are often frequently changed, and the user himself/herself needs to input the directivity of the recipe search. For this reason, it is desirable for the user to be able to interactively set the direction of the search by using a graphical user interface (GUI).

SUMMARY OF THE INVENTION

A process recipe search apparatus according to an embodiment of the present invention searches for an etching recipe that is a parameter of a plasma processing apparatus set so as to etch a sample into a desired shape. The process recipe search apparatus has a target shape decision unit that decides a target shape that defines the desired shape by a plurality of shape elements, a machine learning model creation unit that creates a machine learning model that predicts a process shape of the sample processed by the plasma processing apparatus from the parameter of the plasma processing apparatus, a recipe search unit that uses the machine learning model to search for a candidate etching recipe that becomes a candidate of the etching recipe, a process recipe decision unit that displays, on a display device, a predicted process shape of the sample by the candidate etching recipe predicted by using the machine learning model and decides, as a process recipe that is set to the plasma processing apparatus to cause the sample to be etched, the candidate etching recipe chosen from the displayed candidate etching recipes, and a display shape highlight processing unit that highlights a difference between the predicted process shape and the target shape to display the predicted process shape on the display device.

By facilitating evaluation of the predicted process shapes in the process recipe development using the machine learning, the process recipes suitable for various customer requirements can be easily chosen. Other problems and novel features will become apparent from the description and the accompanying drawings of this specification.

DETAILED DESCRIPTION OF THE PREFERRED EMBODIMENTS

Hereinafter, examples of the present invention will be described in detail with reference to the drawings.

Figure 2:
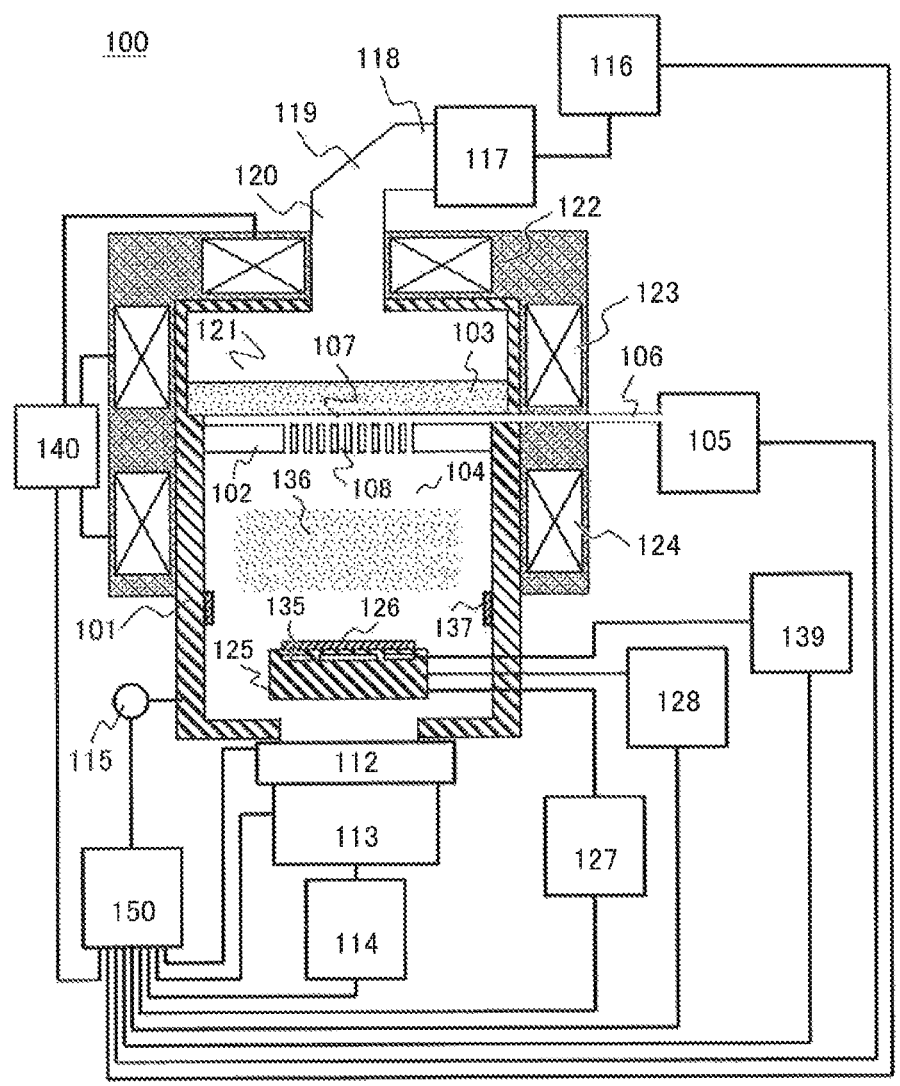
FIG. 2 is a schematic configuration diagram of a plasma processing apparatus.

FIG. 2 is a schematic diagram illustrating a configuration example of a plasma processing apparatus. A plasma processing apparatus 100 is a microwave ECR plasma etching apparatus. The plasma processing apparatus 100 includes a vacuum processing chamber 104 that has an interior in which an electrode 125 on which a wafer 126 to be processed is placed is disposed. The wafer 126 is placed on the electrode 125 by an electrostatic absorption unit 135. A gas is passed from a gas supply mechanism 105 through a gas pipe 106, a space 107, and a shower plate 102, and is supplied to the interior of the vacuum processing chamber 104, and an electric field and a magnetic field from an electric field generator and a magnetic field generator disposed outside of the vacuum processing chamber 104, respectively, act to generate a plasma 136. The plasma 136 contains ions and radicals, and these interact with the surface of the wafer 126 to perform plasma etching processing.

At the lower portion of the vacuum processing chamber 104, a variable conductance valve 112 is disposed, and a turbo molecular pump 113 connected through the variable conductance valve 112 exhausts the gas in the vacuum processing chamber 104. Each of the variable conductance valve 112, the turbo molecular pump 113, and a roughing vacuum pump 114 is connected with a control unit 150, and operation of each device is controlled by a signal from the control unit 150.

Control of the vacuum degree of the vacuum processing chamber 104 is important in the plasma etching processing. A pressure gauge 115 is installed to measure the internal pressure of the vacuum processing chamber 104, and according to the value of the pressure gauge 115, the control unit 150 feedback controls the variable conductance valve 112 to control the pressure of the vacuum processing chamber 104.

At the upper portion of the plasma processing apparatus 100, a microwave power supply 116 that is a first high frequency power supply is installed, and the microwave power supply 116 has a frequency of, for example, 2.45 GHz. A microwave generated by the microwave power supply 116 is propagated through an automatic aligner 117, a rectangular waveguide 118, a rectangular circular waveguide converter 119, and a circular waveguide 120 to a cavity resonator 121. The automatic aligner 117 has the function of automatically suppressing a reflected wave. The cavity resonator 121 has the function of adjusting the microwave electric field distribution to a distribution suitable for the plasma processing. The microwave power supply 116 is controlled by the control unit 150.

Around the vacuum processing chamber 104 and the cavity resonator 121, solenoid coils 122, 123, and 124 that constitute electromagnets are disposed. An electric current is flowed to the solenoid coils 122, 123, and 124 by a coil power supply 140 controlled by the control unit 150, so that the magnetic field is generated in the interior of the vacuum processing chamber 104.

When the high frequency power supply and the magnetic field are formed in the interior of the vacuum processing chamber 104, the plasma by electron cyclotron resonance (ECR) is formed in the region in which the intensities of the electric field and the magnetic field turn into a particular relationship. The electrons present in the interior of the vacuum processing chamber 104 are moved by the Lorentz force while being rotated along the magnetic force line of the magnetic field generated by the solenoid coils 122, 123, and 124. When at this time, the frequency of the microwave propagated from the microwave power supply 116 coincides with the frequency of the rotation of the electrons, the electrons are resonately accelerated to effectively generate the plasma.

The region in which the ECR is generated (ECR plane) can be controlled by the magnetic field created by the solenoid coils 122, 123, and 124. The magnetic field created by the solenoid coils 122, 123, and 124 can be controlled by the electric current flowed to the coils by the control unit 150. The controlling of magnetic field distribution can realize the controlling of the plasma diffusion, and these effects can control distribution of the plasma above the wafer 126, and can improve the uniformity of the plasma processing.

The electrode 125 on which the wafer 126 is placed is located below the ECR plane, and is fixed into the vacuum processing chamber 104. The electrode 125 is circular like the wafer 126. The plasma processing apparatus 100 has a conveying device, such as a robot arm, not illustrated, and by using the conveying device, the wafer 126 is placed on the electrode 125 by the electrostatic absorption unit 135 that is on the electrode 125. A static voltage is supplied from an electrostatic absorption power supply 139 to the electrostatic absorption unit 135.

The electrode 125 is connected with a bias voltage generation unit 127, and through the bias voltage generation unit 127, a bias voltage is applied to the wafer 126. Since the degree that the ions in the plasma 136 are drawn into the wafer 126 side depends on the bias voltage, the process shape of the wafer 126 can be controlled by controlling the bias voltage generation unit 127 by the control unit 150. In addition, the electrode 125 is also connected with a temperature control device 128, so that the chemical reaction process during the processing on the surface of the wafer 126 is adjusted by controlling the temperature, thereby controlling the process shape of the wafer 126. The temperature control device 128 is also controlled from the control unit 150.

The control unit 150 is a computer, and controls the timing and the operation amount of an etching recipe configured from a plurality of steps required for processing the wafer 126 so that the etching recipe is operated in a suitable sequence. The etching recipe is performed on the basis of the previously set recipe.

Figure 13:
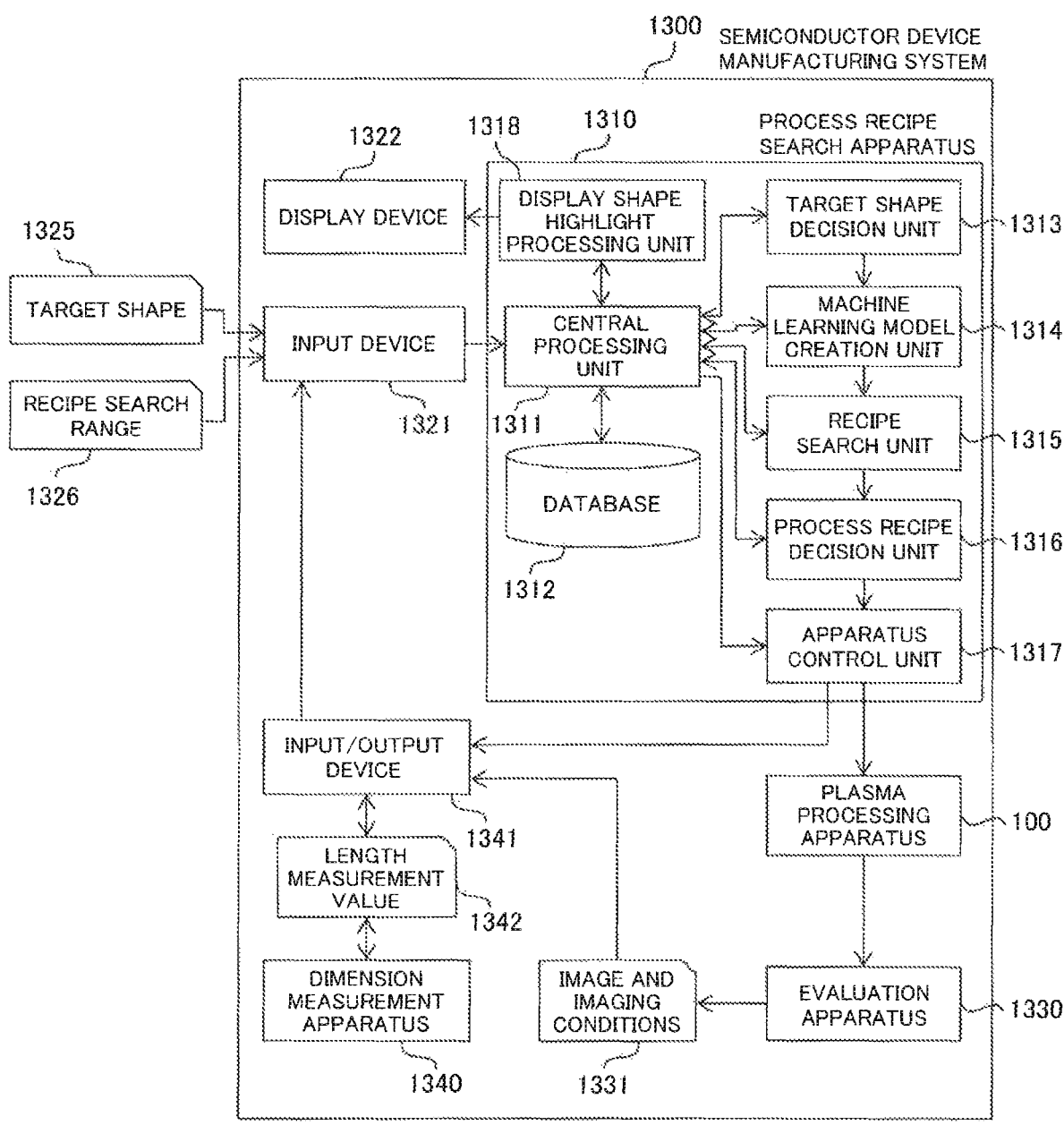
FIG. 13 is a system configuration example of a semiconductor device manufacturing system.

FIG. 13 illustrates a system configuration example of a semiconductor device manufacturing system that searches for the etching recipe. A semiconductor device manufacturing system 1300 has a process recipe search apparatus 1310, an input device 1321, a display device 1322, the plasma processing apparatus 100, an evaluation apparatus 1330, a dimension measurement apparatus 1340, and an input/output device 1341. The user inputs, from the input device 1321, information, such as target shape data 1325 and recipe search range data 1326, thereby interactively executing search for the etching recipe from the information of a candidate etching recipe presented by a GUI displayed on the display device 1322.

The process recipe search apparatus 1310 receives the target shape data 1325 from the input device 1321, and searches for the etching recipe with which the plasma processing apparatus 100 can optimally acquire a target shape. When there is an input of the recipe search range data 1326, search for the etching recipe in a parameter space according to the search condition of the recipe search range data 1326 is executed.

The input device 1321 receives input data from the user or length measurement value data 1342 from the input/output device 1341, and inputs the received data to the process recipe search apparatus 1310. The input device 1321 includes, for example, a keyboard, a pointing device, a touch panel, a storage medium read device, and the like.

The display device 1322 is a display that displays, to the user, the information related to the etching recipe search from the process recipe search apparatus 1310. As other output devices, a printer, a storage medium write device, and the like may be provided.

The plasma processing apparatus 100 is a processing apparatus in which an example thereof is illustrated in FIG. 2. The plasma processing apparatus 100 processes a semiconductor or a semiconductor device on the basis of the etching recipe inputted from the process recipe search apparatus 1310, and passes the processed semiconductor or semiconductor device to the evaluation apparatus 1330.

The evaluation apparatus 1330 photographs the cross section of the semiconductor or the semiconductor device processed by the plasma processing apparatus 100, and acquires a cross-sectional image that is a process result. The evaluation apparatus 1330 includes a charged particle beam application measurement apparatus, such as an SEM (Scanning Electron Microscope) and a TEM (Transmission Electron Microscope). A portion of the semiconductor or the semiconductor device processed by the plasma processing apparatus 100 may be taken out as a fragment, and the fragment may be conveyed to the evaluation apparatus 1330 to be measured. The acquired cross-sectional image is passed, as image and imaging conditions data 1331, to the input/output device 1341 together with an imaging condition, such as a magnification.

The dimension measurement apparatus 1340 receives, through the input/output device 1341, the definition of the target shape inputted from the process recipe search apparatus 1310 and the image and imaging conditions data 1331 from the evaluation apparatus 1330, measures, from the cross-sectional image, predetermined dimensions on the basis of the definition of the target shape, and outputs the measured dimensions as the length measurement value data 1342 to the input/output device 1341. The input/output device 1341 outputs the length measurement value data 1342 to the input device 1321.

The process recipe search apparatus 1310 includes a central processing unit 1311, a database 1312, a target shape decision unit 1313, a machine learning model creation unit 1314, a recipe search unit 1315, a process recipe decision unit 1316, an apparatus control unit 1317, and a display shape highlight processing unit 1318.

Figure 3:
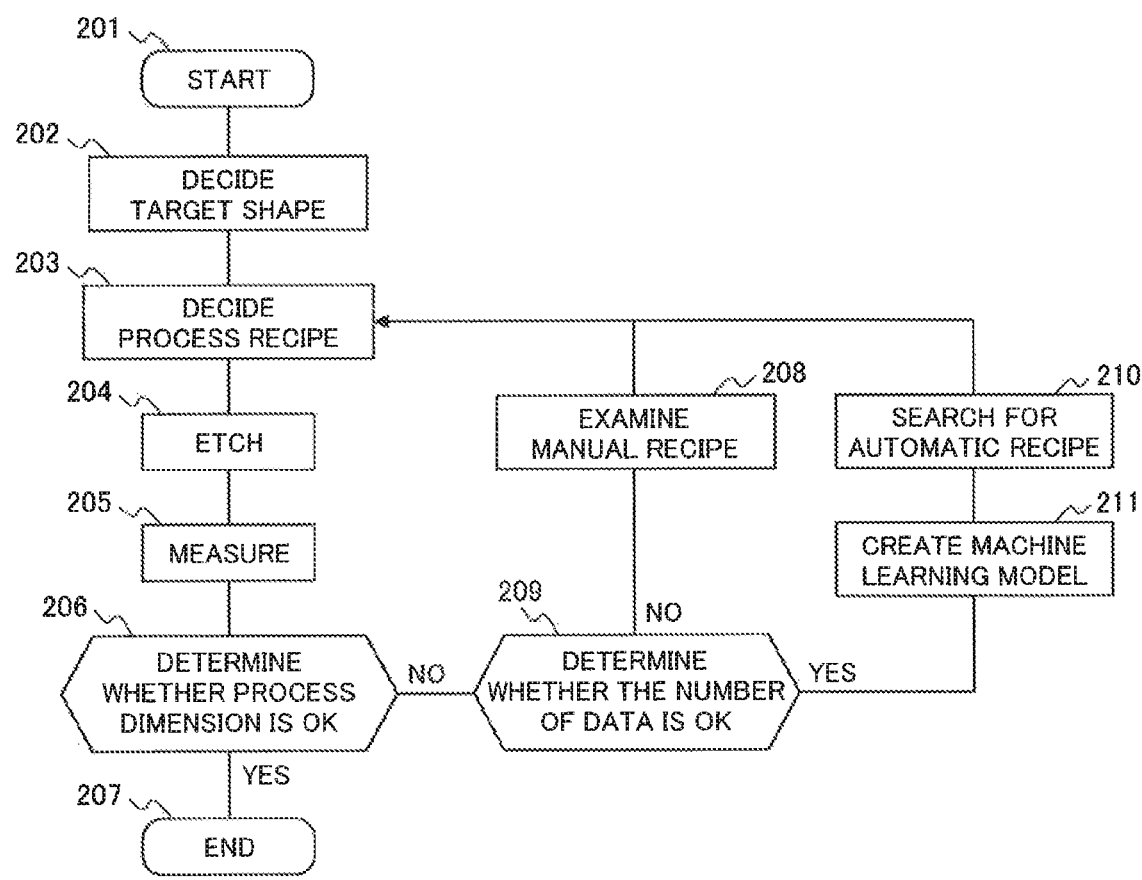
FIG. 3 is a flowchart for searching for an etching recipe.

FIG. 3 is a flowchart by which the process recipe search apparatus 1310 searches for the etching recipe of the plasma processing apparatus 100 by using a machine learning model. The central processing unit 1311 executes the input/output of the data to/from the process recipe search apparatus 1310 and the control of the entire flow. First, the process engineer performs target shape decision 202 from the target shape after the processing. The central processing unit 1311 stores the target shape data 1325 received from the input device 1321 in the database 1312. The definition of the target shape can be updated in the search process, and the target shape is managed by the target shape decision unit 1313. Subsequently, process recipe decision 203 is performed from information about the physical dimensions, the material, and the like of the pattern disposed on the wafer. Since the amount of information about process recipes is small in the early stage of the search, the user inputs the initial etching recipe to the input device 1321, the central processing unit 1311 transfers the initial etching recipe received from the input device 1321 to the process recipe decision unit 1316, and the process recipe decision unit 1316 executes, through the apparatus control unit 1317, etching 204 by the initial etching recipe and measurement 205 of the process result.

After the etching 204 by the plasma processing apparatus 100 is performed, the process result is imaged by the evaluation apparatus 1330, the process result is subjected to the measurement 205 by the dimension measurement apparatus 1340, and the length measurement value data 1342 is inputted through the input/output device 1341 to the process recipe search apparatus 1310. The central processing unit 1311 stores the length measurement value data 1342 in the database 1312 together with the etching recipe (process condition), and performs process dimension determination 206 to compare the measurement value and the target shape.

When the measurement result and the target dimension are different, examination of the process recipe is advanced again.

When the machine learning model is typically created, measurement results by a plurality of process recipes are required. Thus, the central processing unit 1311 performs number-of-data determination 209 for the measurement results, and when the number of data is not sufficient, the process recipe decision 203 to the process dimension determination 206 are performed through manual recipe examination 208 as described above. On the other hand, when it is determined by the number-of-data determination 209 that the number of data of the measurement results is sufficient for creating the machine learning model, the machine learning model creation unit 1314 is started, machine learning model creation 211 is performed by using, as learning data, the combination of the length measurement value and the process condition (the parameter of the plasma processing apparatus) stored in the database 1312, and the recipe search unit 1315 performs automatic recipe search 210 by using the created machine learning model. The process recipe decision unit 1316 displays, on the display device 1322, a plurality of candidate etching recipes extracted on the basis of the machine learning model by the recipe search unit 1315, and prompts the user to perform the decision 203 of a plurality of process recipes considered to achieve the target shape. After the decision 203 of the plurality of process recipes, the etching 204 to the process dimension determination 206 are performed. When the measurement value and the target shape coincide with each other in the process dimension determination 206, development of the etching recipe comes to an end 207.

Figure 14:
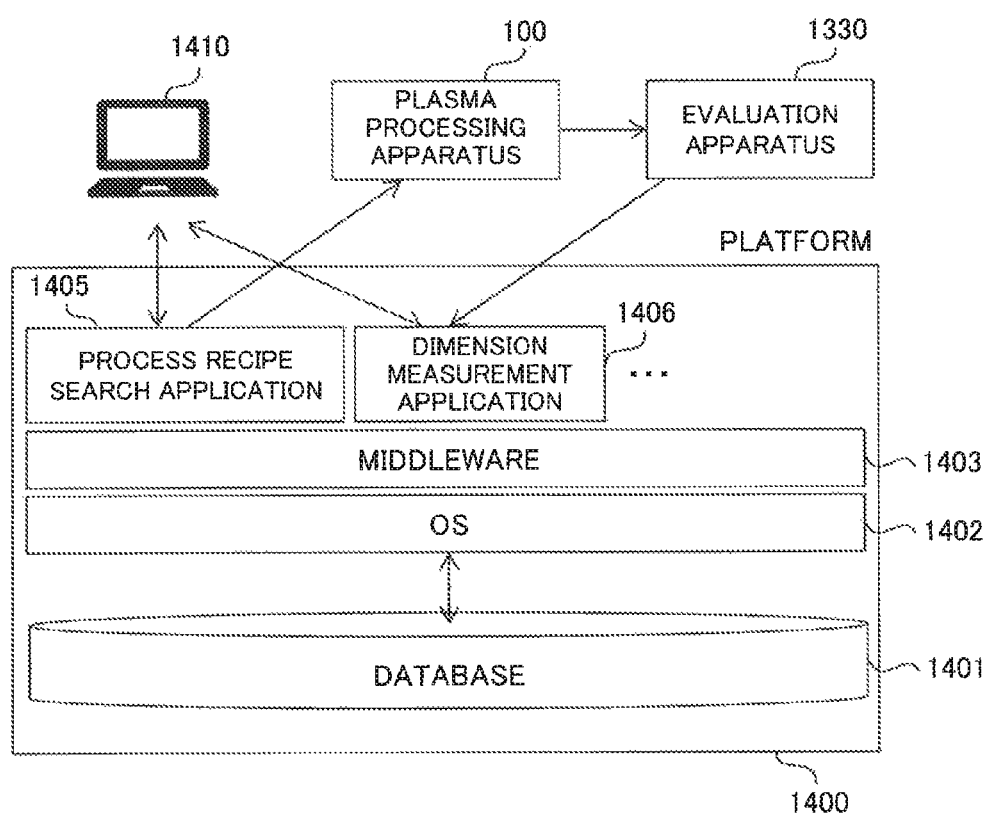
FIG. 14 is a system configuration example of the semiconductor device manufacturing system.

With respect to the semiconductor device manufacturing system in FIG. 13, the semiconductor device manufacturing system that implements search and dimension measurement of the etching recipe as applications on a platform can be considered. Such the implementation example is illustrated in FIG. 14. A platform 1400 is built in the cloud, and the applications that execute the processing on an OS 1402 and middleware 1403 operate. The platform 1400 includes a process recipe search application 1405 that executes the processing corresponding to the process recipe search apparatus 1310, and a dimension measurement application 1406 that executes the processing corresponding to the dimension measurement apparatus 1340. The user can access the platform from a terminal 1410 via a network to use the functions of the applications built on the platform 1400. The platform 1400 includes a database 1401, and data required for executing the applications are stored. Further, the plasma processing apparatus 100 and the evaluation apparatus 1330 are also connected to the platform 1400 so as to be able to exchange the data via the network.

First Example

Typically, in the early stage of the etching recipe development, the measurement value is greatly deviated from the target shape, and while a plurality of etching recipes is tried, the process shapes are gradually approximate to the target shape. As the actual measurement results are approximate to the target shape, the predicted process shapes by the etching recipes proposed from the machine learning model by the automatic recipe search also become the shape approximate to the target shape. It is difficult to visually recognize the difference of the actual shapes only with the numerical value data, whereas as described as the first problem, even when each predicted process shape and the target shape are imaged and displayed, as they become approximate in shape, the difference of each predicted process shape from the target shape is not drawn so that the user can visibly recognize it. The process recipe search apparatus 1310 includes the display shape highlight processing unit 1318, and can highlight the shape difference between the predicted process shape and the target shape to display it on the display device 1322.

Figure 1A:
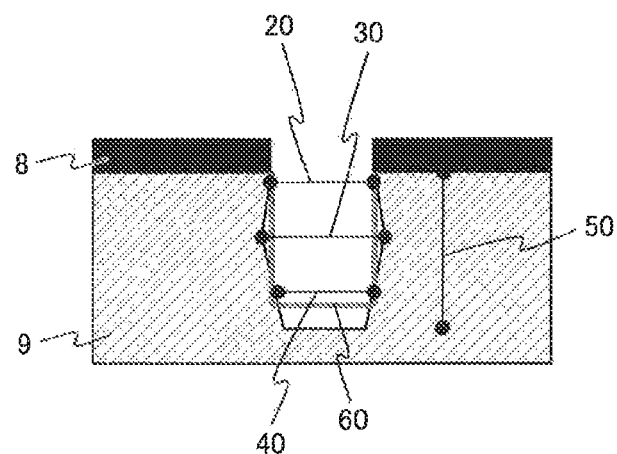
FIG. 1A is an example of a predicted process shape.

One of the predicted process shapes by the etching recipes (candidate etching recipes) proposed from the machine learning model is schematically illustrated in FIG. 1A. The predicted process shape illustrated in FIG. 1A is an example of the cross-sectional shape of a trench structure (hereinafter, referred to as a trench shape). The width of the trench shape is decided according to a mask 8, and a substrate 9 is etched from the opening of the mask 8, so that the trench shape is formed in the substrate 9. A target shape 60 is also illustrated by a thick line in FIG. 1A. Widths 20, 30, and 40 of the trench shape are defined as widths in which the depths in the trench to be measured are different. For example, the process engineer defines the target shape by the widths 20, 30, and 40 of the trench shape and a depth 50 of the trench shape. In the case of the predicted process shape in FIG. 1A, the widths 20 and 30 of the trench shape are larger than the widths of the target shape, and the width 40 of the trench shape is smaller than the width of the target shape. In addition, the depth 50 of the trench shape is larger than the depth of the target shape. As the deviation of the predicted process shape from the target shape becomes smaller, it is more difficult to visually grasp the problem of such the predicted process shape.

Figure 1B:
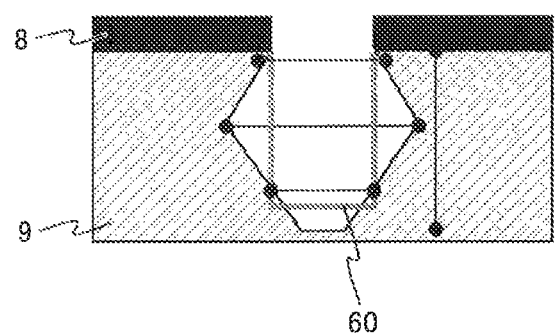
FIG. 1B is an example of a highlight displayed predicted process shape.

In this example, by the drawing method in FIG. 1B, the difference of the predicted process shape from the target shape can be highlight displayed even when the predicted process shape is the same predicted process shape as FIG. 1A.

Figure 4A:
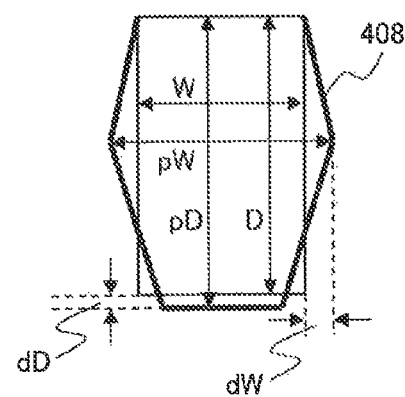
FIG. 4A is a diagram for explaining a highlight display method.

Highlight display methods for highlighting errors with respect to the target shape of this example will be described with reference to FIGS. 4A and 4B. FIG. 4A illustrates a trench contour when not highlight displayed. When a trench contour 408 has a predicted depth pD and a predicted width pW and the target shape has a target depth D and a target width W, a difference dD between the predicted depth pD and the target depth D and a difference dW between the predicted width pW and the target width W are expressed by dD=D−pD and dW=(W−pW)/2, respectively.

Here, when magnification factors (called highlight magnifications) of the depth and the width used for the highlight display are a and b, errors with respect to the target shape that are respectively dD1 and dW1 are defined as follows: dD1=a×dD and dW1=b×dW. The highlight magnifications a and b may be automatically calculated from the difference between the predicted process shape and the target shape, or the user may designate them on the GUI.

Figure 4B:
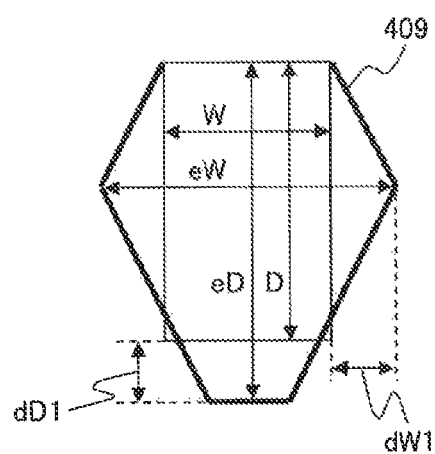
FIG. 4B is a diagram for explaining a highlight display method.

FIG. 4B illustrates the trench contour when highlight displayed, and in a trench contour 409, the errors dD1 and dW1 defined as described above are used so that a predicted depth eD and a predicted width eW are eD=D+dD1 and eW=W+2×dW1, respectively. Compared with the normal display illustrated in FIG. 4A, the difference from the target shape can be drawn visually clearly, and the shape deviations of the different portions, such as the trench width and the depth, can be seen on the basis of the target shape at the same time.

A method for setting the highlight magnifications a and b will be described with reference to FIG. 5. A display window 501 that displays the predicted process shape on the GUI has a longitudinal length T and a lateral width Y. At this time, in order not to exceed beyond the display window 501, the magnification a with respect to the depth and the magnification b with respect to the width are required to satisfy the relationships of $a<(T-D)/dD$ and $b<(Y-W)/(2\times dW)$, respectively. According to the window displaying method, a margin portion can also be considered to be as offset.

Figure 5:
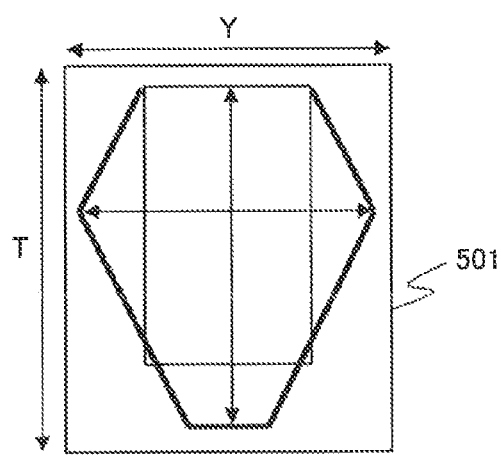
FIG. 5 is a diagram for explaining a method for setting highlight magnifications.
Figure 5:
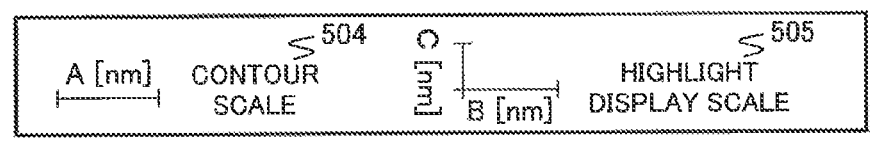

In addition, as illustrated in FIG. 5, when the predicted process shape is highlight displayed, three scales should be displayed as needed. One of them is a contour scale 504 that represents the display of the target shape, and each of the others is a highlight display scale 505 that represents the predicted process shape in which the error is highlight displayed. In this example, since the width and the depth of the trench shape are highlight displayed at the respective magnifications, two orthogonal scales are illustrated.

Here, the method for highlighting and displaying the width and the depth of the trench that are the most basic process shapes in the etching has been described. In the etching processing, other than such the simple target, control of the taper structure in which the trench side wall gradually becomes narrower, roughness suppression by which the trench side wall suppresses surface roughness by the etching, and control of the shape of bowing in which the side wall spreads midway therethrough are often required. Among these, the roughness that evaluates surface roughness typically has a small evaluation value, and the feature of the shape cannot be highlighted at a magnification of about several times. For this reason, it is effective to set, on the basis of an RA value that represents the degree of surface roughness, the highlight magnification to be several times or several hundred times with respect to the RA value.

In addition, although in FIGS. 3 and 4B, the example in which the errors of the predicted process shape with respect to the target shape are highlighted and displayed has been described, the highlight display targets in this example are not limited to the target shape and the predicted process shape, and are also applicable when the difference between arbitrary shapes is highlighted and displayed. Its example will be described below. With an image B being highlight displayed with respect to an image A, A is called a reference image, and B is called a comparison image. For example, assumed is a using method by which process results by two process recipes are measured according to the definition of the target shape and the process shapes acquired from the measurement values for the two process results are compared.

When the reference image has a trench depth DA, the reference image has a trench width WA, the comparison image has a trench depth DB, and the comparison image has a trench width WB, a difference dD3 between the trench depth of the reference image A and the trench depth of the comparison image B and a difference dW3 between the trench width of the reference image A and the trench width of the comparison image B are expressed by $dD3=DA-DB$ and $dW3=(WA-WB)/2$, respectively.

Here, when highlight magnifications of the depth and the width used for the highlight display are c and d, errors with respect to the reference image that are respectively dD4 and dW4 are defined as follows: $dD4=c\times dD3$ and $dW4=d\times dW3$. The highlight magnifications c and d may be automatically calculated from the difference between the reference image A and the comparison image B, or the user may designate them on the GUI. By using the errors dD4 and dW4 defined as described above, a depth fD and a width fW of the trench shape of the comparison image B highlight displayed are $fD=D+dD4$ and $fW=W+2\times dW4$, respectively.

In this way, the difference can be drawn visually clearly, not only to the target shape but also to the arbitrary reference image, and choosing of the better etching recipes can be facilitated by comparing the process shapes by the good etching recipes.

Figure 6:
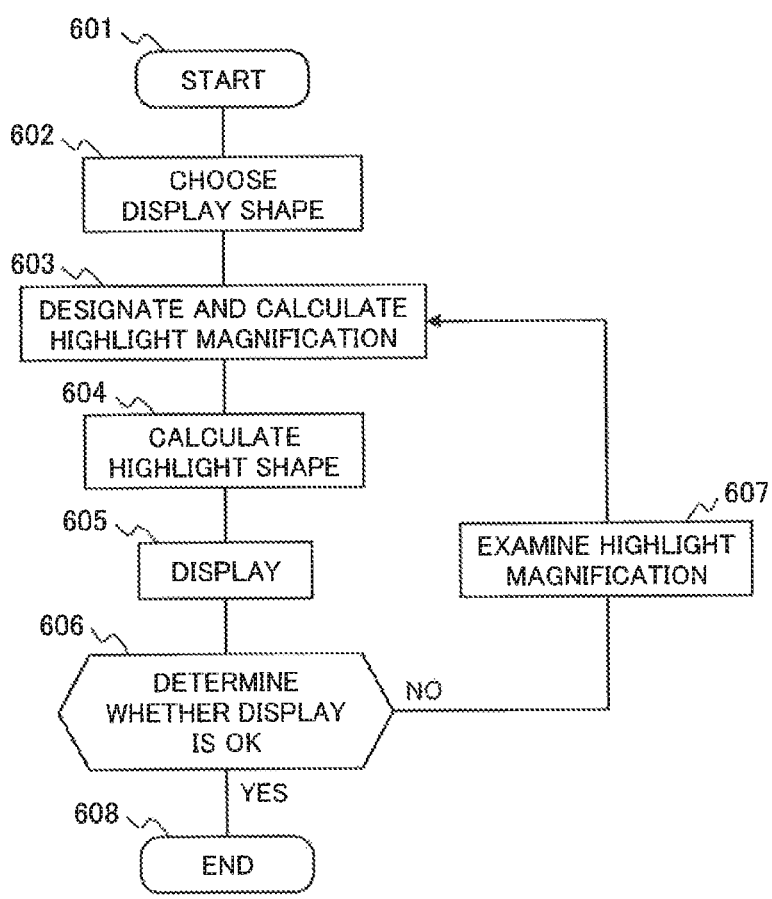
FIG. 6 is a drawing flowchart for performing highlight display.

FIG. 6 is a drawing flowchart by which the display shape highlight processing unit 1318 performs the highlight display. To perform the highlight display, first, display shape choice 602 is performed. For example, an element that defines the target shape, such as the trench width and the trench depth, is chosen. Next, the highlight magnification is designated by display highlight magnification designation and calculation 603. This may be automatically calculated from the trench shape and the like. Next, highlight shape calculation 604 is performed, and display 605 of the calculation result is performed on the display device 1322. From the display result, the user performs determination 606 whether or not the display content is good, and when the highlight magnification is required to be reexamined, the highlight magnification is adjusted by highlight magnification examination 607, thereby performing the display highlight magnification designation and calculation 603 to the display result determination 606 again.

Figure 7:
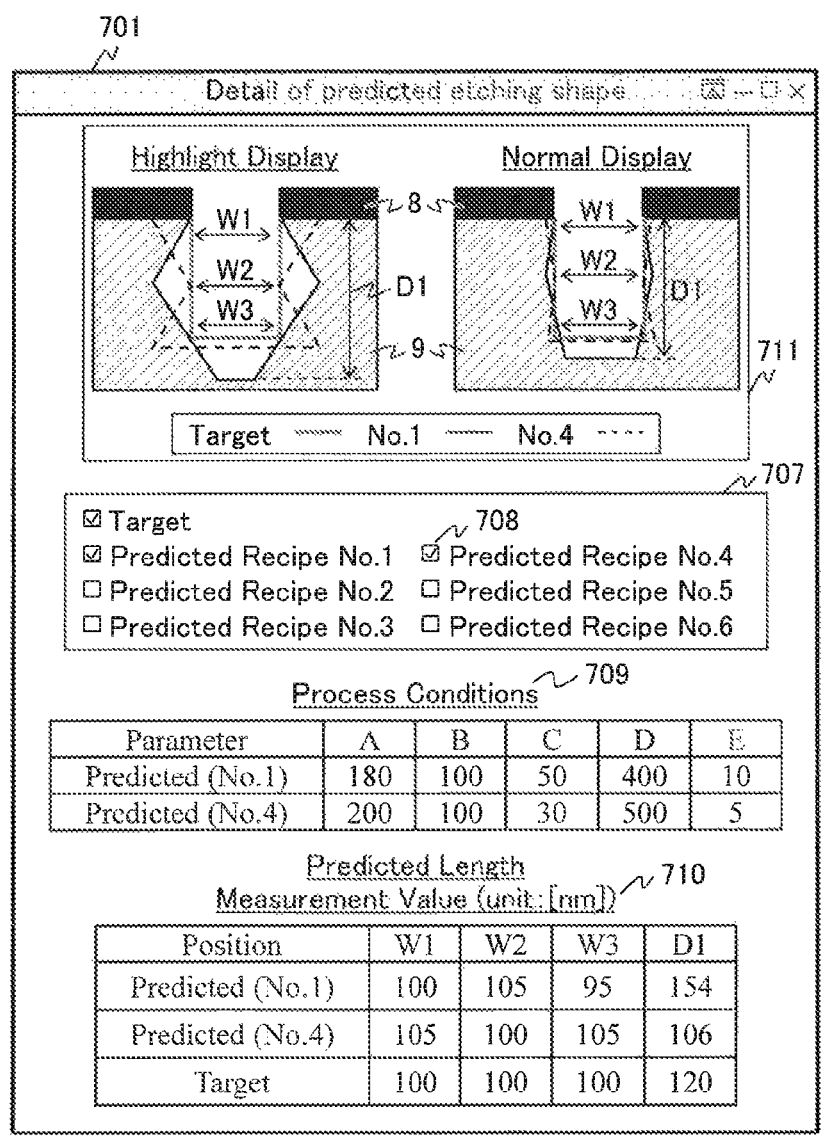
FIG. 7 is an example of a GUI for choosing process recipes from a candidate etching recipe group.

FIG. 7 illustrates an example of a graphical user interface (GUI) displayed on the display device 1322 by the process recipe decision unit 1316 in order for the engineer to choose the process recipes from among the candidate etching recipes determined from the machine learning model in the process recipe decision 203. The upper area of a GUI 701 is a display window 711 in which the trench shapes are displayed by the normal display and the highlight display. Therebelow, a choice region 707 is disposed, and the trench shapes displayed in the display window 711 are chosen from the choice region 707. In the choice region 707, the candidate etching recipes (predicted recipes) chosen by the machine learning model and the target shape are displayed, and with respect to each of them, a choice checkbox 708 for choosing display/non-display is disposed. In the case of FIG. 7, the predicted process shapes by the predicted recipes No. 1 and No. 4 among the candidate etching recipes and the target shape are displayed in the display window 711. By changing the check marks in the choice region 707, the predicted process shapes by other predicted recipes can be displayed.

Below the choice region 707, a process conditions display table 709 of the candidate etching recipes is disposed. In the process conditions display table 709, the process conditions of the predicted recipes in which the predicted process shapes are displayed in the display window 711 are displayed. The process conditions are the process conditions recommended by the machine learning model. By comparing the process condition of the predicted recipe and the predicted process shape, the user can advance choice of the process condition from the viewpoint according to each problem.

Below the process conditions display table 709, a predicted length measurement value table 710 that represents the magnitude of the element (in this example, widths W1, W2, and W3 and a depth D1) of the predicted process shape displayed in the display window 711 is disposed. The predicted length measurement value is a value calculated by inputting the process condition of the predicted recipe to the machine learning model. It is difficult for the predicted length measurement value table 710 to be useful for the recipe choice, but when the input error of the target shape or a clear abnormality is observed in the shape and the like recommended from the machine learning model, the user confirms the predicted length measurement value table 710 and can thus easily notice such the state.

Figure 8A:
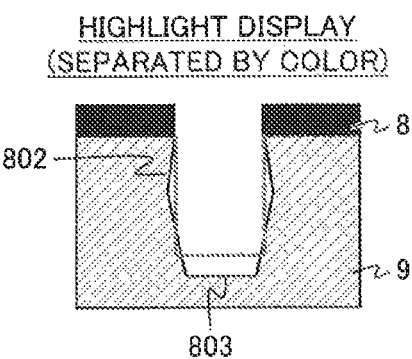
FIG. 8A is another example of highlight display.
Figure 8B:
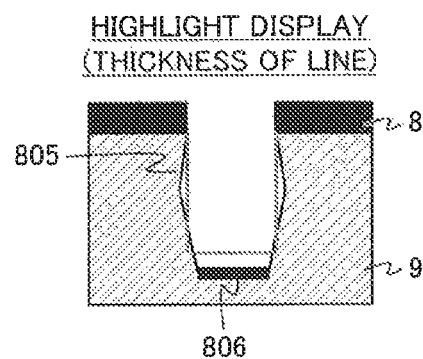
FIG. 8B is a further example of highlight display.
Figure 8C:
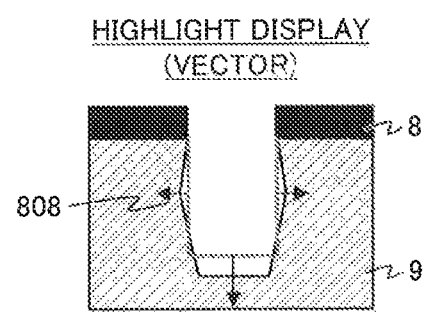
FIG. 8C is a still further example of highlight display.

In order for the user to highlight and recognize the difference of the predicted process shape from the target shape, display methods other than the highlight display that has been described so far can also be considered. The display methods as such will be described with reference to FIGS. 8A to 8C. FIG. 8A illustrates a method for displaying the difference from the target shape by color. For example, when the difference from the target shape is large, it is displayed in red, and when the difference from the target shape is small, it is displayed in green, and in the case of FIG. 8A, a trench bottom 803 is displayed in red, and a trench side wall 802 is displayed in green. Thus, the shape element in which the user's priority is high (in this case, the depth and the like) can be visually chosen by color. FIG. 8B illustrates an example in which the difference from the target shape is indicated by the thickness of a line. In this case, the larger line width represents that the difference from the target shape is large, and a trench bottom 806 is displayed by a line thicker than a trench side wall 805. FIG. 8C illustrates a method for vector displaying a deviation amount as an arrow. In this case, how much the corresponding measurement point is deviated from the target shape in two dimensions is easily recognized. In FIG. 8C, since the shape elements are the width and the depth, vectors 808 become vectors directed in the lateral direction and the longitudinal direction. With respect to this, when the taper of the side wall and the tilt of the bottom face are defined as the shape elements, the error of the taper and the error of the tilt are expressed as vectors directed in the normal direction of the side wall and the bottom face. By performing such the two-dimensional vector representation, the predicted process shape is easily recognized.

Second Example

As a second example, a method for evaluating the sensitivity of the candidate etching recipe using the machine learning model described as the second problem and a GUI will be described. The GUI described below is displayed on the display device 1322 by the process recipe decision unit 1316 when the process recipe decision 203 is performed from the candidate etching recipe searched for by using the machine learning model.

Figure 9:
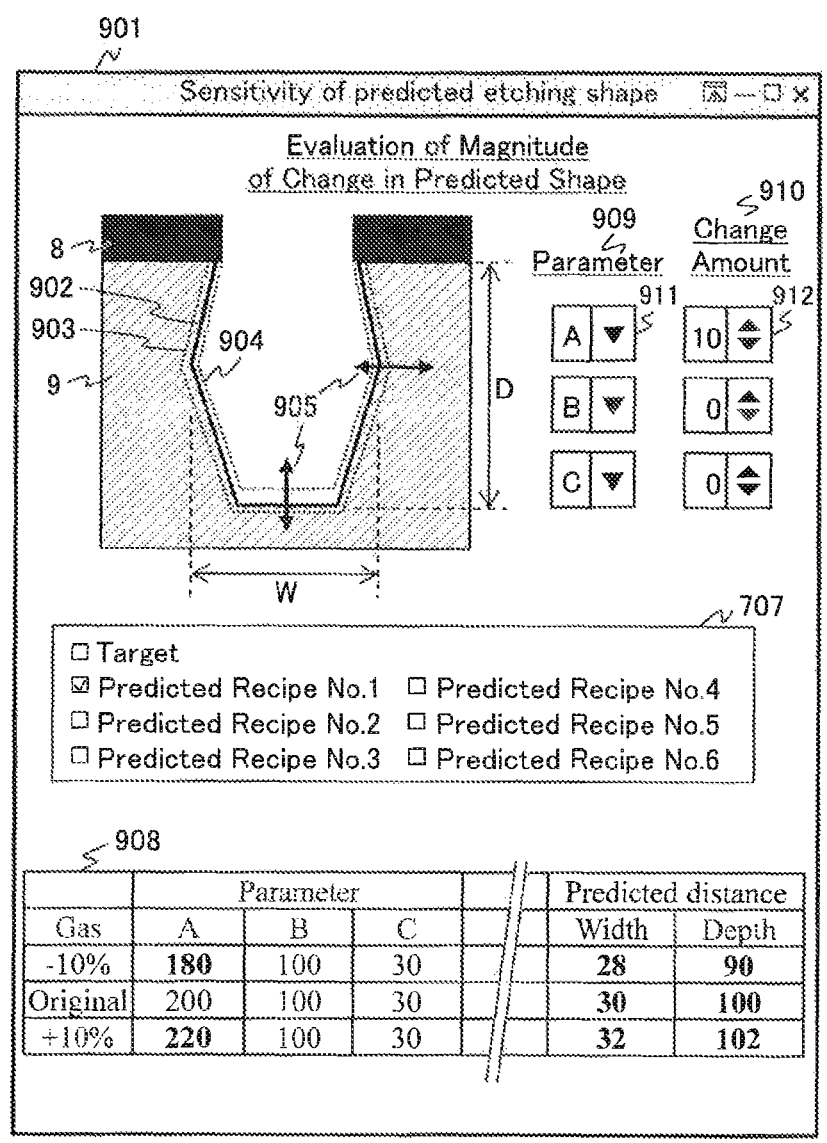
FIG. 9 is an example of a GUI for displaying the sensitivity of the candidate etching recipe.

FIG. 9 illustrates an example of a GUI 901 in which the process recipe decision unit 1316 displays the sensitivity of the candidate etching recipe determined from the machine learning model. At the upper area of the GUI 901, a shape display window that displays the magnitude of the change in the predicted shape is disposed. The shape display window displays, by a solid line, a predicted process shape 902 acquired from the candidate etching recipe, and in addition, the shape display window displays, by dotted lines, a predicted process shape 903 of a sensitivity evaluation etching recipe in which a parameter A that is one of the process conditions of the etching recipe is changed by +10% and a predicted process shape 904 of a sensitivity evaluation etching recipe in which the parameter A of the etching recipe is changed by −10%. An arrow 905 that represents the change amount of the predicted process shape is an arrow that represents the change amount of the predicted process shape in which the parameter A is changed, and the smaller arrow indicates that the change amount of the predicted process shape is small. In the case of the predicted recipe No. 1 illustrated in FIG. 9, it is found that the change amount of the trench depth by changing the parameter A by +10% is small and that the change amount of the trench depth by changing the parameter A by −10% is large. On the contrary, it is found that the change amount of the trench width by changing the parameter A by −10% is small and that the change amount of the trench width by changing the parameter A by +10% is large.

Although FIG. 9 illustrates the display of the shape change when only the parameter A of the etching recipe is changed, the GUI 901 has a choice region 909 of the parameters for performing the sensitivity evaluation, and a plurality of parameters can also be changed at the same time from choice drop-down boxes 911. The change amounts of the parameters used for the evaluation are displayed in a designation region 910, and the change amount can be set for each parameter from a change amount setting scroll bar 912.

At the middle area of the GUI 901, the choice region 707 is disposed, and the candidate etching recipes that are desired to be sensitivity evaluated can be chosen to evaluate the sensitivity. In evaluation of these candidate etching recipes, the sensitivity evaluation etching recipe in which the parameter is changed for each evaluation may be inputted to the machine learning model to determine the predicted process shape, or the predicted process condition of the etching recipe around the predicted process shape may be previously calculated and at the time of designating the change amount of the parameter, the corresponding predicted process shape may be called from the storage device of the computer.

At the lower area of the GUI 901, a display table 908 of the etching recipe is disposed. The display table 908 displays the etching recipe to be sensitivity evaluated (here, No. 1, the Original section), the sensitivity evaluation etching recipes when the parameter A is changed by ±10% to evaluate the sensitivity, and each predicted process shape. The target shape may be described together in the display table 908.

Third Example

Figure 10:
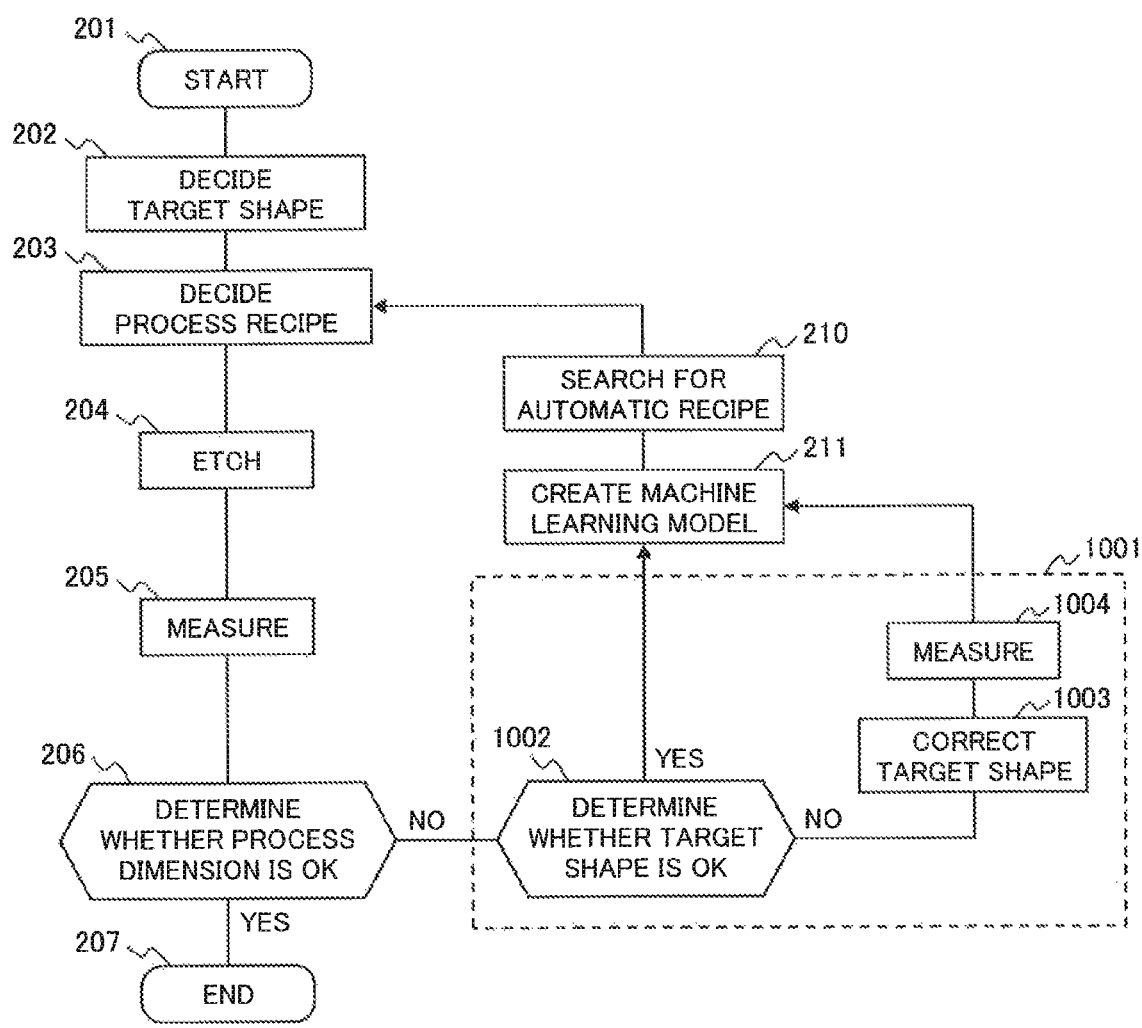
FIG. 10 is a flowchart for searching for the etching recipe.

FIG. 10 is a flowchart by which the process recipe search apparatus 1310 develops the etching recipe of the plasma processing apparatus 100 by using the machine learning model. The point that a recipe search flow 1001 indicated by a dotted line and changing the target shape is added in search for the process recipe using the machine learning model is the difference from the flowchart illustrated in FIG. 3. Typically, while the etching recipe is being developed, the process engineer finds out the problem of the recipe development, and adds a new shape element for solving the problem to redefine the target shape. By performing the highlight display described in the first example for the added shape element, the difference from the target shape can be highlighted, so that a new problem can be easily found out.

The same steps as the flowchart in FIG. 3 are indicated by the same reference numerals, and the overlapped description is omitted. When there is a difference between the target shape and the measurement result in the process dimension determination 206, target shape determination 1002 is performed. If the target shape is good, the process shape acquired by the previous measurement 205 and the etching recipe that has subjected to the etching 204 are added as new learning data, and the processing proceeds to the machine learning model creation 211. On the other hand, if a problem is found in the target shape in the target shape determination 1002, the target shape decision unit 1313 performs target shape correction 1003, performs measurement 1004 of the corrected target shape to create a new dataset, and the processing proceeds to the machine learning model creation 211. In this way, each time the new shape element is added to the target shape, the target shape decision unit 1313 performs the length measurement for the new shape element from an enormous number of the image and imaging conditions data 1331 that have been subjected to experiment, with respect to the dimension measurement apparatus 1340 through the apparatus control unit 1317, remakes the dataset, and updates the machine learning model.

Figure 11:
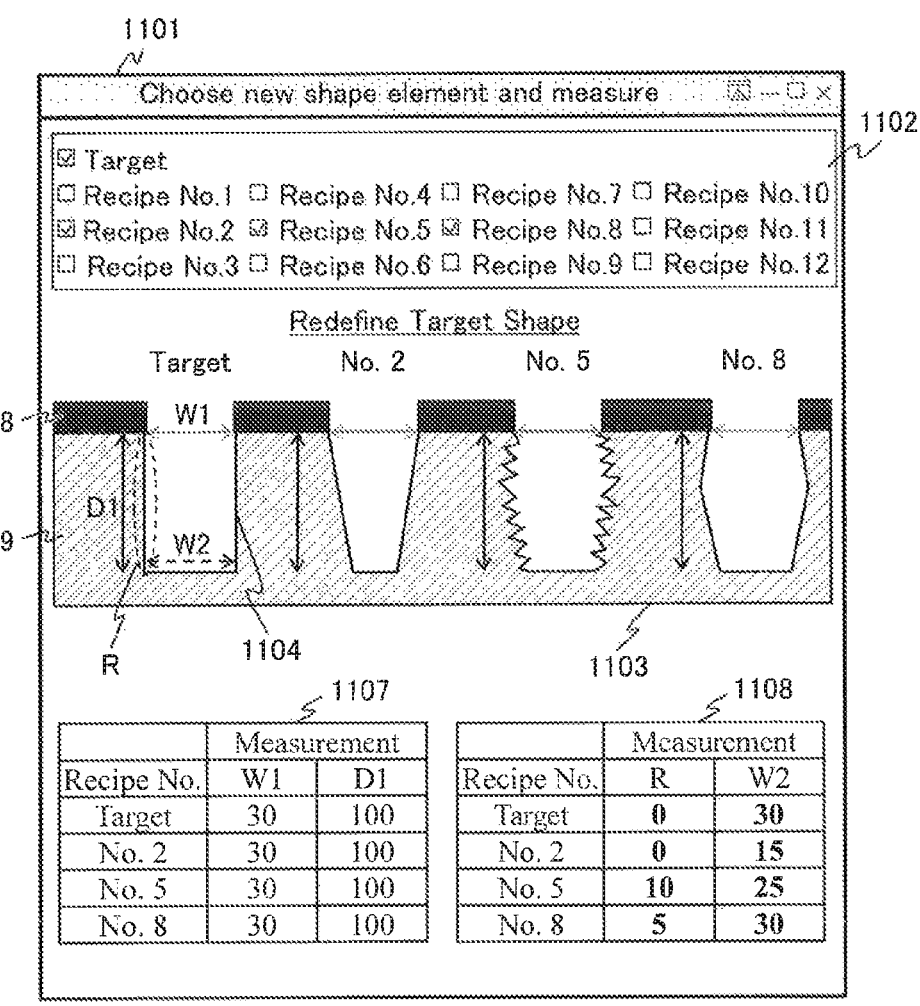
FIG. 11 is an example of a GUI for redefining a target shape.

FIG. 11 illustrates an example of a GUI displayed on the display device 1322 by the target shape decision unit 1313 for adding the shape element to redefine the target shape and remaking the dataset. At the upper area of a GUI 1101, a choice region 1102 for choosing the etching recipe in which the etching 204 is performed and the process result is acquired by the measurement 205 is disposed. The choice region 1102 has checkboxes, and the process results of the predicted models into which the check marks are put are displayed in a shape display region 1103 at the middle area. In the display in the shape display region 1103, it is also possible to overlap and display an electron microscope image in addition to the target shape. By overlapping the electron microscope image, the process engineer easily notices the overlooked new shape element.

FIG. 11 illustrates an example in which the process shapes corresponding to the redefined target shape are displayed in the shape display region 1103. Here, it is assumed that only an opening width W1 and the depth D1 are defined in the unredefined target shape. At the lower area, an existing measurement value table 1107 is displayed, but as is apparent from here, the opening width W1 and the depth D1 of the process results of all the predicted recipes are equal to those of the target shape. However, the actual trench shapes are different, and this shows that the definition of the unredefined target shape is insufficient. Accordingly, the process engineer designates roughness R and a bottom width W2 that are new shape elements with respect to a target shape 1104 displayed in the shape display region 1103. The dimensions of the shape elements newly defined from the electron microscope image are measured, the display of the shape display region 1103 is updated, and the dimensions are displayed in a new measurement value table 1108 at the lower area. At this time, the measurement may be manually performed by the user, or the measurement may be automatically performed by applying the automated measurement technique on the basis of image processing, such as edge detection. By preparing such the GUI, it becomes possible to prepare the dataset from the electron microscope image correctly and immediately for proceeding to the machine learning model creation 211 on the basis of the corrected target shape.

Fourth Example

As a fourth example, a method by which by visualizing a constraint condition in the etching recipe search, the user simply designates the complicated target shape and the recipe search range described as the third problem is limited and a GUI will be described. It is assumed that the GUI described below is displayed following the GUI 1101 for correcting the target shape described in the third example, but even when the target shape is not corrected, the GUI described below can be displayed to adjust the search range.

Figure 12:
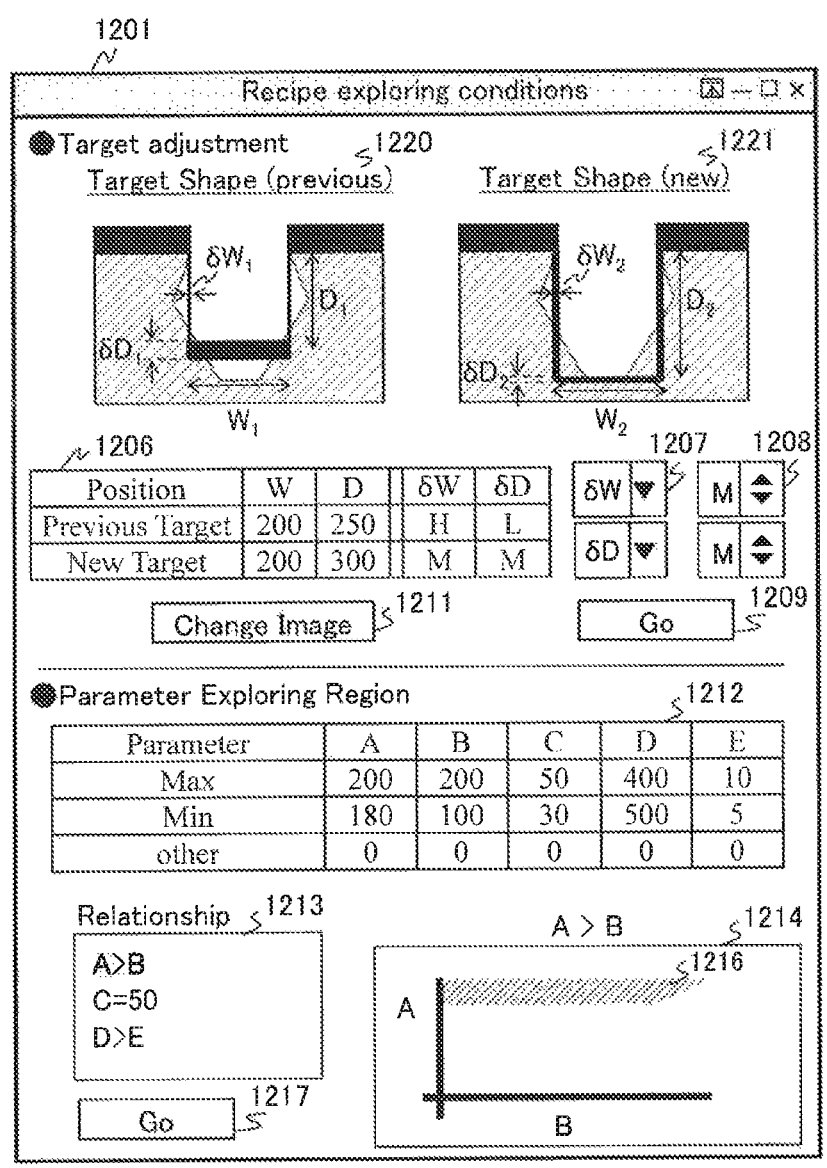
FIG. 12 is an example of a GUI for designating likelihoods of the target shape and a recipe search range.

FIG. 12 illustrates an example of a GUI 1201 displayed on the display device 1322 by the recipe search unit 1315 and designating likelihoods of the target shape and the recipe search range. In the display region at the upper area, an unredefined target shape 1220 and a redefined target shape 1221 are illustrated. Typically, the likelihood is set for each of the shape elements defining the target shape to the target shape managed by the target shape decision unit 1313, and for example, the trench width is decided as ±1 nm and the like and the trench bottom is decided as ±10 nm and the like. The magnitude of the likelihood can also be adjusted, and the likelihood that is set to be slightly wide in the early stage of the etching recipe development can also be narrowed gradually and strictly. The information of the likelihood is essential for choosing the candidate etching recipe, whereas if the likelihoods are set to a plurality of shape elements of the target shape, the user's target management becomes difficult accordingly.

The GUI 1201 visualizes the likelihood of the target shape. When a likelihood $\delta D_1$ of the trench depth and a likelihood $\delta W_1$ of the trench width in the unredefined target shape 1220 are compared, the likelihood of the trench depth is wider. In this way, the shape element whose likelihood is narrow is represented to be thin, and the shape element whose likelihood is wide is represented to be thick, so that it becomes possible to recognize the likelihood in addition to the target shape at the same time.

On the other hand, in the redefined target shape 1221, a likelihood $\delta W_2$ of the trench width is wider than the likelihood $\delta W_1$ of the trench width of the unredefined target shape 1220, and a likelihood $\delta D_2$ of the trench depth is narrower than the likelihood $\delta D_1$ of the trench depth of the unredefined target shape 1220. The changes as such are compared and displayed to visualize the change in the target shape including the likelihood, thereby reducing the user's load.

The size (W, D) and the likelihood ($\delta W$, $\delta D$) of the target shape are displayed in a target shape table 1206. The likelihood is designated in a choice pulldown box 1207 of the shape element of the target shape, and can be changed by using a choice pulldown box 1208 of the likelihood. This change is decided by pressing a shape reflection button 1209, and is reflected to the target shape table 1206.

For the choice pulldown box 1208 of the likelihood, a numerical value may be able to be chosen, and a qualitative magnitude relationship may be able to be chosen like an importance degree "higher, middle, or lower". This considers that the clear numerical value target can be undecided in the early stage of the recipe development.

In addition, since the values of the target shape and the likelihood can be decided by referring to the best condition at the recipe development, the user can also change the background image by clicking a display image change button 1211 to input the target shape only by mouse operation without becoming conscious of the scale of the image.

The lower area of the GUI 1201 visualizes the etching recipe search range by the machine learning model. As illustrated in a recipe search range table 1212, examples of the parameter of the etching recipe include, for example, the limit of the gas flow rate and the constraint of the applicable electrode voltage, the controllable electrode temperature, and the like. In addition to this, when there are the relationship properties between various parameters derived from the apparatus controlling method and the direction of the etching recipe required by the user (for example, search for the recipe in which a certain gas is used as little as possible, and the like), the etching recipe search is performed in the range that fulfills those relationship properties and direction, so that it is easier to more efficiently acquire the recipe required by the user from an enormous parameter space.

To a condition designation box 1213, such the relationship properties between the parameters and the direction are inputted as a constraint relational expression. The constraint relational expression may be expressed, not only by the simple form such as four arithmetic operations but also by the complicated relational expression of elementary mathematics suggested from a simulator. For example, "A>B" is chosen from the condition designation box 1213, and the search range on the basis of this relational expression is represented as a search range 1216 in a search range display graph 1214. The search range 1216 is visualized on the basis of the recipe search range table 1212, so that the user can confirm that the inputted constraint relational expression is correctly reflected. The recipe search range data 1326 is decided by pressing a search range decision button 1217, and the central processing unit 1311 transfers the decided recipe search range data 1326 to the recipe search unit 1315, thereby reflecting it to the recipe search.

REFERENCE SIGNS LIST

8: mask, 9: substrate, 20, 30, 40: trench width, 50: trench depth, 60: target shape, 100: plasma processing apparatus, 101: container, 102: shower plate, 103: dielectric window, 104: vacuum processing chamber, 105: gas supply mechanism, 106: gas pipe, 107: space, 108: fine pore, 112: variable conductance valve, 113: turbo molecular pump, 114: roughing vacuum pump, 115: pressure gauge, 116: microwave power supply, 117: automatic aligner, 118: rectangular waveguide, 119: rectangular circular waveguide converter, 120: circular waveguide, 121: cavity resonator, 122, 123, 124: solenoid coil, 125: electrode, 126: wafer, 127: bias voltage generation unit, 128: temperature control device, 135: electrostatic absorption unit, 136: plasma, 137: grounding, 139: electrostatic absorption power supply, 140: coil power supply, 150: control unit, 408, 409: trench contour, 501: display window, 504: contour scale, 505: highlight display scale, 701, 901, 1101, 1201: GUI, 707: choice region, 708: choice checkbox, 709: process conditions display table, 710: predicted length measurement value table, 711: display window, 802, 805: trench side wall, 803, 806: trench bottom, 808: vector, 902, 903, 904: predicted process shape, 905: arrow, 908: display table, 909: choice region, 910: designation region, 911: choice drop-down box, 912: change amount setting scroll bar, 1102: choice region, 1103: shape display region, 1104: target shape, 1107: existing measurement value table, 1108: new measurement value table, 1206: target shape table, 1207, 1208: choice pulldown box, 1209: shape reflection button, 1211: display image change button, 1212: recipe search range table, 1213: condition designation box, 1214: search range display graph, 1216: search range, 1217: search range decision button, 1220: unredefined target shape, 1221: redefined target shape, 1300: semiconductor device manufacturing system, 1310: process recipe search apparatus, 1311: central processing unit, 1312: database, 1313: target shape decision unit, 1314: machine learning model creation unit, 1315: recipe search unit, 1316: process recipe decision unit, 1317: apparatus control unit, 1318: display shape highlight processing unit, 1321: input device, 1322: display device, 1325: target shape data, 1326: recipe search range data, 1330: evaluation apparatus, 1331: image and imaging conditions data, 1340: dimension measurement apparatus, 1341: input/output device, 1342: length measurement value data, 1400: platform, 1401: database, 1402: OS, 1403: middleware, 1405: process recipe search application, 1406: dimension measurement application, 1410: terminal.

What is claimed is:

1. A plasma processing apparatus that searches for an etching recipe that is a parameter of the plasma processing apparatus set so as to etch a sample into a desired shape, the apparatus comprising:
a processor configured to
determine a target shape that defines the desired shape by a plurality of shape elements;
create a machine learning model that predicts a process shape of the sample processed by the plasma processing apparatus from the parameter of the plasma processing apparatus;
search, using the machine learning model, for a candidate etching recipe that becomes a candidate of the etching recipe;
output, on a display device, a predicted process shape of the sample by the candidate etching recipe predicted by using the machine learning model and decides, as a process recipe that is set to the plasma processing apparatus to cause the sample to be etched, the candidate etching recipe chosen from the displayed candidate etching recipes;
highlighting a difference between the predicted process shape and the target shape to display the predicted process shape on the display device;
output, on the display device, the predicted process shape of the sample predicted by using the machine learning model, by a sensitivity evaluation etching recipe in which at least one parameter included in the candidate etching recipe is changed;
superimpose each of the predicted process shape by the candidate etching recipe and the predicted process shape by the sensitivity evaluation etching recipe in a state where the difference from the target shape is highlighted; and
output the superimposed predicted process shapes on the display device; and
a computer configured to control etching of the sample by the plasma processing apparatus in accordance with the chosen etching recipe.

2. The plasma processing apparatus according to claim 1, wherein the the processor is further configured to output the predicted process shape on the display device by enlarging the difference between the target shape and the predicted process shape at a highlight magnification set for each of the shape elements.

3. The plasma processing apparatus according to claim 1, wherein the processor is further configured to output, on the display device, the difference between the predicted process shape and the target shape so that the difference can be visually recognized on the predicted process shape, and
wherein the difference between the predicted process shape and the target shape is displayed by a color or a line width of the shape element in the predicted process shape or is displayed by overlapping, with the shape element, a vector that represents a deviation amount of the predicted process shape with respect to the target shape.

4. The plasma processing apparatus according to claim 1, wherein the processor is further configured to output, on the display device, a range of the parameter that can be taken by the candidate etching recipe of the plasma processing apparatus, and when a constraint between the parameters of the plasma processing apparatus is designated, the candidate etching recipe is searched for in a constrained parameter space.

5. An etching recipe search method that uses a process recipe search apparatus that searches for an etching recipe that is a parameter of a plasma processing apparatus set so as to etch a sample into a desired shape, the method comprising the steps of:
- deciding a target shape that defines the desired shape by a plurality of shape elements;
- creating a machine learning model that predicts a process shape of the sample processed by the plasma processing apparatus from the parameter of the plasma processing apparatus;
- using the machine learning model to search for a candidate etching recipe that becomes a candidate of the etching recipe;
- displaying, on a display device, a predicted process shape of the sample by the candidate etching recipe predicted by using the machine learning model;
- highlighting a difference between the predicted process shape and the target shape to display the predicted process shape on the display device; and
- etching the sample by the plasma processing apparatus in accordance with the candidate etching recipe,
- wherein the machine learning model is used to predict the process shape of the sample by a sensitivity evaluation etching recipe in which at least one parameter included in the candidate etching recipe is changed, and
- wherein each of the predicted process shape by the candidate etching recipe and the predicted process shape by the sensitivity evaluation etching recipe is superimposed in a state where the difference from the target shape is highlighted, and is displayed on the display device.

6. The etching recipe search method according to claim 5, wherein the predicted process shape is displayed on the display device by enlarging the difference between the target shape and the predicted process shape at a highlight magnification set for each of the shape elements.

7. The etching recipe search method according to claim 5, wherein a range of the parameter that can be taken by the candidate etching recipe of the plasma processing apparatus is displayed on the display device, and when a constraint between the parameters of the plasma processing apparatus is designated, the candidate etching recipe is searched for in a constrained parameter space.

8. An etching recipe search method that uses a process recipe search apparatus that searches for an etching recipe that is a parameter of a plasma processing apparatus set so as to etch a sample into a desired shape, the method comprising the steps of:
- deciding a target shape that defines the desired shape by a plurality of shape elements;
- creating a machine learning model that predicts a process shape of the sample processed by the plasma processing apparatus from the parameter of the plasma processing apparatus;
- using the machine learning model to search for a candidate etching recipe that becomes a candidate of the etching recipe;
- displaying, on a display device, a predicted process shape of the sample by the candidate etching recipe predicted by using the machine learning model;
- highlighting a difference between the predicted process shape and the target shape to display the predicted process shape on the display device; and
- etching the sample by the plasma processing apparatus in accordance with the candidate etching recipe,
- wherein a plurality of candidate etching recipes chosen from the candidate etching recipes displayed on the display device are decided as process recipes that are set to the plasma processing apparatus to cause the samples to be etched,
- wherein when the decided process recipes are set to the plasma processing apparatus and among the process shapes acquired by etching the samples, the process shape by a first process recipe is a reference image, and the process shape by a second process recipe is a comparison image, the comparison image is displayed on the display device by enlarging a difference between the comparison image and the reference image at a highlight magnification set for each of the shape elements,
- wherein when the decided process recipe is set to the plasma processing apparatus and the process shape acquired by etching the sample does not coincide with the target shape, the target shape is corrected,
- wherein the machine learning model is updated, and
- wherein the updated machine learning model is used to search for the candidate etching recipe that becomes the candidate of the etching recipe.

9. A semiconductor device manufacturing system that includes a terminal, a plasma processing apparatus, and a platform connected to the terminal and the plasma processing apparatus via a network and on which a processor configured to execute a process recipe search application that searches for an etching recipe that is a parameter of the plasma processing apparatus set so as to etch a sample into a desired shape is implemented,
- wherein the process recipe search application, when executed by the processor, causes the platform to perform:
- a step of deciding a target shape that defines the desired shape by a plurality of shape elements;
- a step of creating a machine learning model that predicts a process shape of the sample processed by the plasma processing apparatus from the parameter of the plasma processing apparatus;
- a step of using the machine learning model to search for a candidate etching recipe that becomes the candidate of the etching recipe;
- a step of displaying, on the terminal, a predicted process shape of the sample by the candidate etching recipe predicted by using the machine learning model;
- a step of using the machine learning model to predict the process shape of the sample by a sensitivity evaluation etching recipe in which at least one parameter included in the candidate etching recipe is changed;
- a step of superimposing each of the predicted process shape by the candidate etching recipe and the predicted process shape by the sensitivity evaluation etching recipe in a state where the difference from the target shape is highlighted and displaying the superimposed predicted process shapes on the terminal; and
- a step of causing the plasma processing apparatus to etch the sample in accordance with the candidate etching recipe,
- wherein for the predicted process shape displayed on the terminal, a difference between the predicted process shape and the target shape is highlighted.

10. The semiconductor device manufacturing system according to claim 9, wherein the predicted process shape is displayed on the terminal by enlarging the difference between the target shape and the predicted process shape at a highlight magnification set for each of the shape elements.

11. The semiconductor device manufacturing system according to claim 9,
   wherein the process recipe search application executes a step of displaying, on the terminal, a range of the parameter that can be taken by the candidate etching recipe of the plasma processing apparatus, and
   wherein when a constraint between the parameters of the plasma processing apparatus is designated from the terminal, the candidate etching recipe is searched for in a constrained parameter space in the step of searching for the candidate etching recipe.

12. The semiconductor device manufacturing system according to claim 9, wherein the process recipe search application executes:
   a step of deciding, as a process recipe that is set to the plasma processing apparatus to cause the sample to be etched, the candidate etching recipe chosen from the candidate etching recipes displayed on the terminal; and
   a step of setting the process recipe to the plasma processing apparatus.

* * * * *